(12) United States Patent
Miyawaki et al.

(10) Patent No.: US 7,888,189 B2
(45) Date of Patent: Feb. 15, 2011

(54) METHOD FOR MANUFACTURING ELECTRONIC DEVICE

(75) Inventors: Yoshiteru Miyawaki, Takatsuki (JP); Dongxu Wang, Takatsuki (JP)

(73) Assignee: Sanyu Rec Co., Ltd., Osaka (JP)

( * ) Notice: Subject to any disclaimer, the term of this patent is extended or adjusted under 35 U.S.C. 154(b) by 134 days.

(21) Appl. No.: 12/232,334

(22) Filed: Sep. 16, 2008

(65) Prior Publication Data

US 2009/0186454 A1 Jul. 23, 2009

(30) Foreign Application Priority Data

Jan. 23, 2008 (JP) .............................. 2008-012682

(51) Int. Cl.
*H01L 21/00* (2006.01)
(52) U.S. Cl. ...................... 438/127; 264/278; 264/279; 264/279.1
(58) Field of Classification Search ................. 438/127; 264/278, 279, 279.1
See application file for complete search history.

(56) References Cited

U.S. PATENT DOCUMENTS

2007/0138697 A1* 6/2007 Takeda et al. ............... 264/278

FOREIGN PATENT DOCUMENTS

JP    A-2007-005722    1/2007

* cited by examiner

*Primary Examiner*—Matthew S Smith
*Assistant Examiner*—John M Parker
(74) *Attorney, Agent, or Firm*—Posz Law Group, PLC

(57) ABSTRACT

A method for manufacturing an electronic device with a plurality of lead frames for individually supporting an electronic component 6 surrounded by a casing 8, which method includes the steps of charging a resin 10 into each casing 8 on a substrate 5 on which the plurality of supporting lead frames are disposed, and cutting the substrate 5 into individual lead frames. The step of charging the first resin includes the step of using a mask 1 that has through-holes 1a in positions corresponding to regions surrounded by the casings 8, to charge the resin 10 into the regions surrounded by the casings 8. The method is capable of improving the productivity of manufacturing electronic devices with lead frames for individually supporting an electronic component surrounded by a casing, and making the shape of the resin that covers the electronic components even.

8 Claims, 17 Drawing Sheets

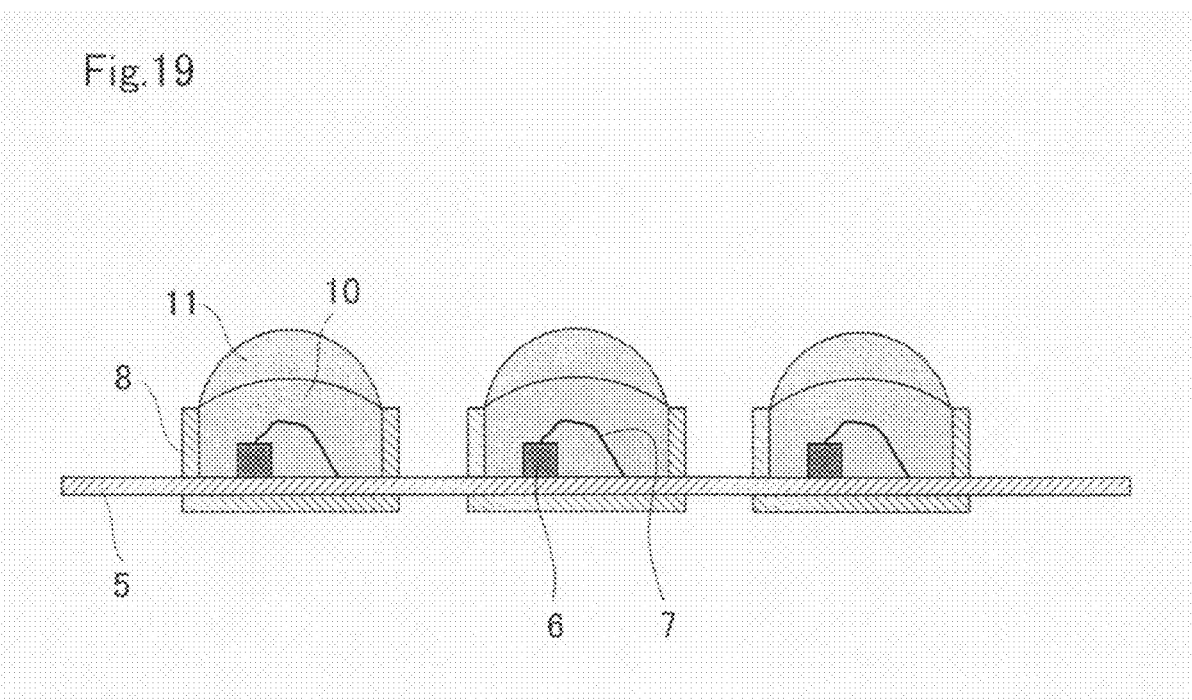

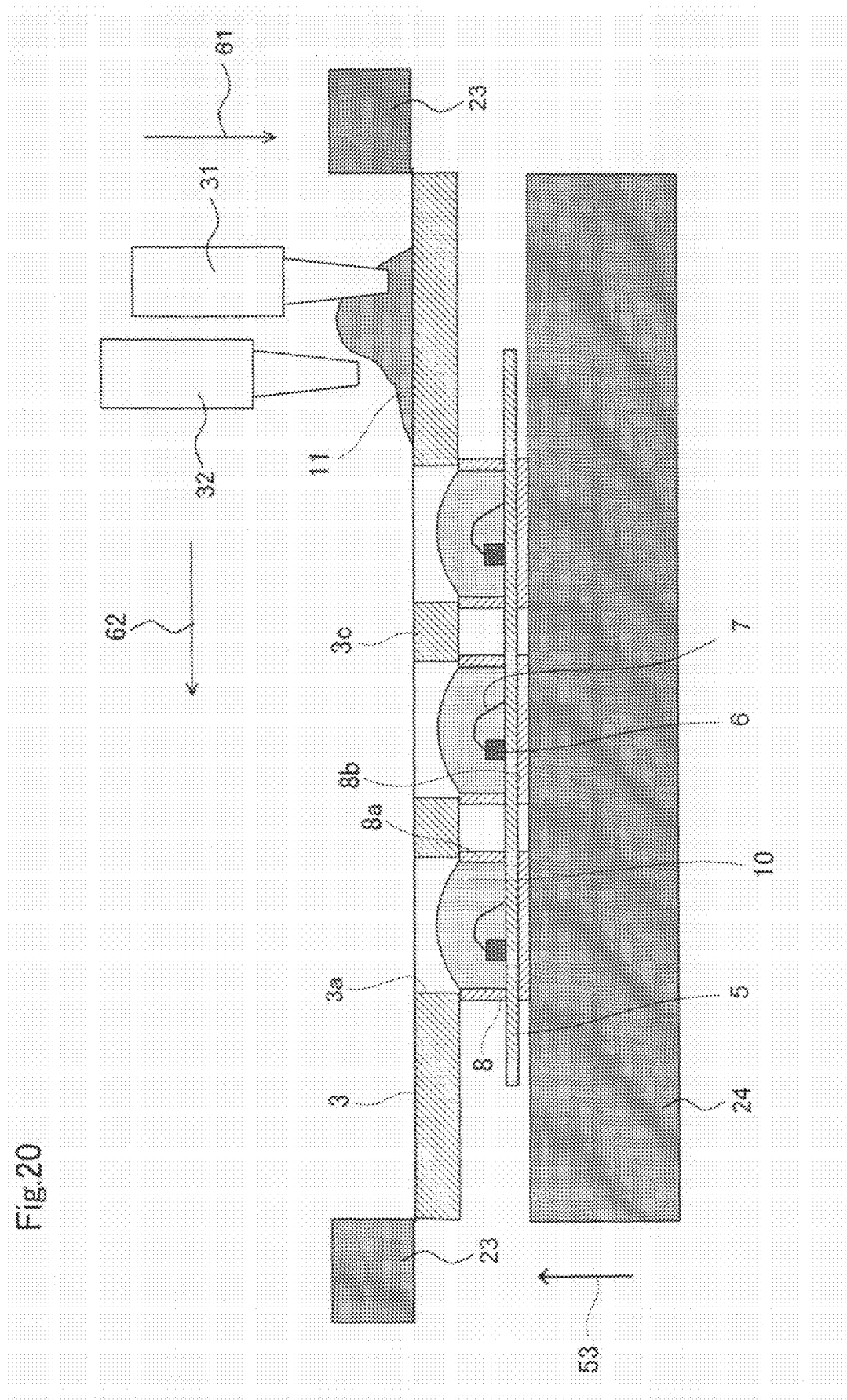

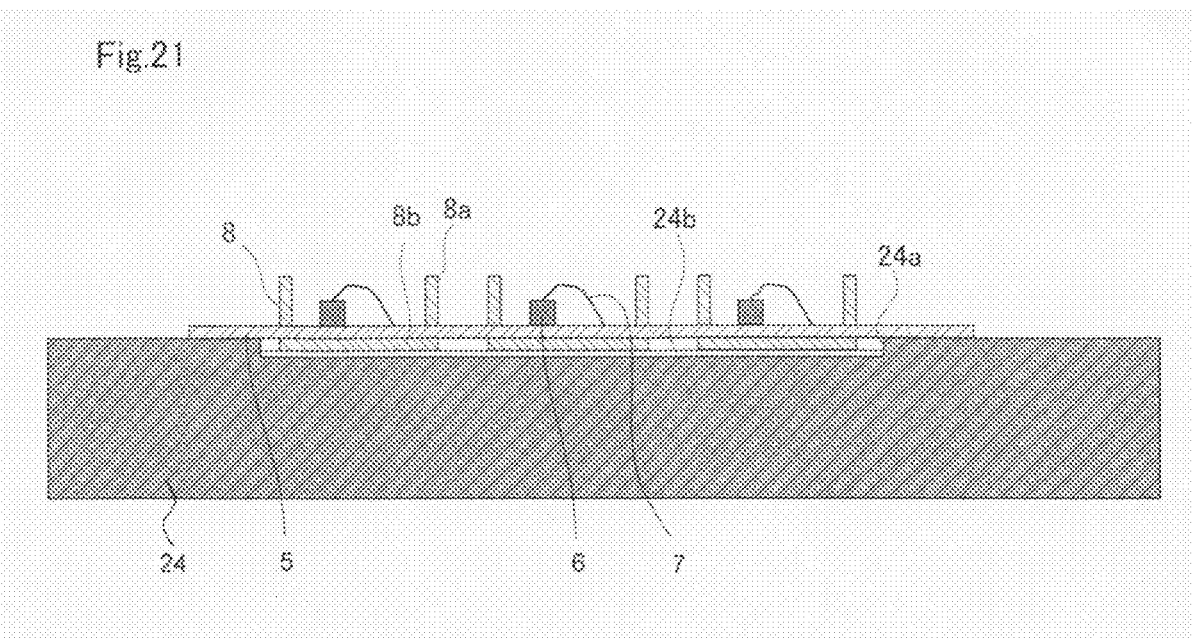

METHOD FOR MANUFACTURING ELECTRONIC DEVICE

BACKGROUND OF THE INVENTION (1) Field of the Invention

The present invention relates to a method for manufacturing an electronic device.

(2) Description of the Related Art

Electronic components such as ICs (integrated circuits), light-emitting elements, and the like are supported by lead frames that connect them with external electronic circuits. The electronic components supported by the lead frames are coated with a resin or the like for protection. When the electronic components are light-emitting devices, a protective layer is formed using a translucent resin to allow the light-emitting devices to emit light out of the device.

In the manufacture of an electronic device with lead frames, an electronic component is placed in each lead frame, and then resin is positioned to cover the electronic component. Japanese Unexamined Patent Publication No. 2007-5722 discloses a method for resin-encapsulating electronic components by positioning optical semiconductor devices in depressions formed on a base, and then positioning resin into the depressions using a dispenser.

With the method in which resin is positioned using a dispenser, the step of positioning resin in the regions of the lead frames where electronic components are located requires a long time because it places the resin in individual regions where individual electronic components are located. Moreover, when resin is positioned in complicated places, the use of a dispenser complicates the conditions of applying the resin to the device.

In addition, because a dispenser is configured to discharge resin via, for example, air pressure, it is difficult to control the amount of discharged resin to a certain level. This increases variations in the amount of the resin discharged from the dispenser, making the shape of the cured resin uneven.

An object of the present invention is to provide a method for manufacturing an electronic device with lead frames for individually supporting an electronic component surrounded by a casing. The method is capable of improving productivity, and making the shape of the resin that covers each electronic component even.

BRIEF SUMMARY OF THE INVENTION

A method for manufacturing an electronic device according to the invention is a method for manufacturing an electronic device that contains a plurality of lead frames for individually supporting an electronic component surrounded by a casing, the method including the steps of charging a first resin into each casing on a base on which the plurality of lead frames are formed; and cutting the base to separate the lead frames into individual lead frames. The step of charging the first resin includes the step of using a mask having through-holes in positions corresponding to regions surrounded by the casings, to charge the first resin into the regions.

Another method for manufacturing an electronic device according to the invention is a method for manufacturing an electronic device that contains a plurality of lead frames for individually supporting an electronic component surrounded by a casing, the method including the steps of charging a first resin into the casing of each of the plurality of lead frames held by a holder; and detaching each of the lead frames from the holder. The step of charging the first resin includes the step of using a mask having through-holes in positions corresponding to regions surrounded by the casings, to charge the first resin into the regions.

Preferably, in each of the above-defined methods according to the invention, the step of charging the first resin includes the steps of moving a first squeegee along a surface of the mask to charge the first resin into the regions; and moving a second squeegee along the surface of the mask while pressing the second squeegee against the surface to remove any excess portion of the first resin, thereby making a surface of the first resin flat. The step of moving the second squeegee uses, as the second squeegee, a squeegee with a rigidity lower than that of the first squeegee.

Preferably, each of the above-defined methods according to the invention further includes the steps of curing the first resin; and positioning a second resin on the surface of the first resin, using a mask having through-holes in positions corresponding to the regions surrounded by the casings.

Preferably, in each of the above-defined methods according to the invention, the step of positioning the second resin uses a mask different from the mask used in the step of charging the first resin.

The present invention provides a method for manufacturing an electronic device that contains lead frames for individually supporting an electronic component surrounded by a casing. The method is capable of improving productivity, and making the shape of the resin even.

BRIEF DESCRIPTION OF THE DRAWINGS

FIG. 19 is a diagram illustrating a second step of the method for manufacturing an electronic device according to the fourth embodiment.

FIG. 20 is a diagram illustrating another method for manufacturing an electronic device according to the fourth embodiment.

FIG. 21 is a cross section illustrating a modified example of the method for manufacturing an electronic device according to the first embodiment.

DETAILED DESCRIPTION OF THE INVENTION

First Embodiment

Referring to FIGS. 1 to 11, a method for manufacturing an electronic device according to a first embodiment is described.

Figure 1:
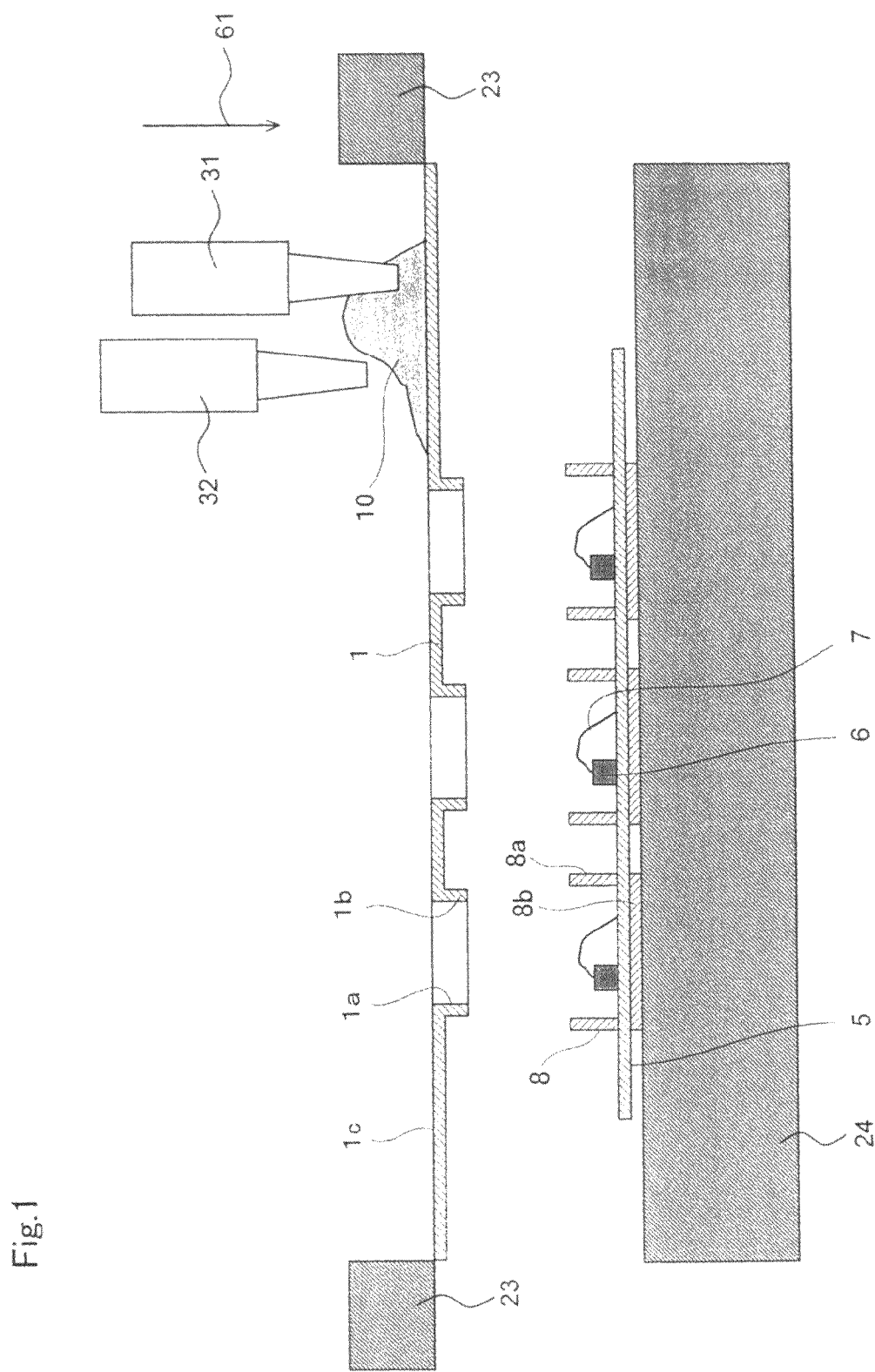
FIG. 1 is a diagram illustrating a first step of a method for manufacturing an electronic device according to a first embodiment.

FIG. 1 is a diagram illustrating a first step of the method for manufacturing an electronic device according to this embodiment. FIGS. 1 to 6 are schematic cross sections, each illustrating principal parts of an apparatus for manufacturing an electronic device. The apparatus for manufacturing an electronic device according to this embodiment is an apparatus for resin-encapsulating electronic components such as light-emitting devices, etc., disposed on the surface of a substrate.

The electronic device of this embodiment includes electronic components 6. In this embodiment, the electronic components 6 are light-emitting diodes (LEDs) used as light-emitting devices. The base of this embodiment includes a substrate 5. Lead wires (not illustrated) are formed on the surface of the substrate 5. The electronic components 6 include a wire 7 for making an electrical connection with a lead wire.

The electronic device of this embodiment includes lead frames for supporting each electronic component 6. The term "lead frame" herein denotes a member that is formed to support an electronic component and supply electricity to the electronic component. The lead frame of this embodiment is silver-plated on a substrate composed of aluminum or copper. In this embodiment, a plurality of lead frames are formed on the substrate 5 serving as a base, and separated into individual lead frames after resin encapsulation.

The electronic device of this embodiment includes casings 8, each fixed to a lead frame and formed to surround an electronic component 6. Each casing 8 of this embodiment has a wall portion 8a and a bottom portion 8b. From a plan view, the wall portion 8a of this embodiment has a circular opening formed in a rectangular base (see FIG. 7). The casing 8 has a box shape in which one surface is open. Each electronic component 6 is disposed so as to be surrounded by a casing 8. The electronic component 6 is disposed inside the casing 8. The casing 8 of this embodiment is U-shaped in cross section (see FIG. 2 and the like).

In this embodiment, the casings 8 are first formed on the substrate 5. The casings 8 are formed by resin injection molding. The wall portion 8a and bottom portion 8b are integrally formed. Examples of casing materials include thermoplastic resins such as PPA (polyphthalamide) resins, PC (polycarbonates), acrylic resins, PA (polyamide) resins, etc. The step of forming casings is not limited to this embodiment, and the casings may be formed by any method using any materials.

The apparatus for manufacturing an electronic device of this embodiment includes a support device for supporting the substrate 5. The support device has a stage 24 as a platform on which the substrate 5 is placed. The stage 24 of this embodiment fixes the substrate 5 thereon. The support device of this embodiment includes a raising and lowering device for raising and lowering the stage 24. The raising and lowering device is configured to move the stage 24 vertically. The apparatus for manufacturing an electronic device of this embodiment also includes a controller for controlling the support device.

The apparatus for manufacturing an electronic device includes a mask 1 as a first mask. The mask 1 of this embodiment has a flat, plate-like portion 1c. The mask 1 also has through-holes 1a. The through-holes 1a are holes that penetrate the plate-like portion 1c. The through-holes 1a are formed in positions that, from a plan view, correspond to the respective electronic components 6 disposed on the substrate 5.

The through-holes 1a of this embodiment have a circular shape from a plan view. The through-holes 1a have a rectangular cross section when cut along the surface vertical to the main surface of the mask 1. The term "main surface of the mask 1" herein denotes the surface whose area of the plate-like portion 1c is maximal. The shape of the through-holes 1a is not limited to that of this embodiment, and any shape may be employed. For example, the through-holes 1a may have a tapered cross section when cut along the surface vertical to the main surface of the mask 1.

The mask 1 has a rib 1b formed along the portion of each through-hole 1a. The rib 1b protrudes from the plate-like portion 1c. The rib 1b is formed to fit into the region surrounded by each casing 8 formed on the substrate 5. The rib 1b has a circular shape from a plan view. The mask 1 of this embodiment includes a frame member 23. The frame member 23 is formed along the edges of the plate-like portion 1c.

The apparatus for manufacturing an electronic device of this embodiment includes a squeegee 31 as a first squeegee for supplying a resin 10 inside the through-holes 1a of the mask 1. The apparatus also includes a squeegee 32 as a second squeegee for removing excess resin. Each of the squeegees 31, 32 can move vertically to the main surface of the mask 1. Each of the squeegees 31, 32 can also move along the main surface of the mask 1.

The apparatus for manufacturing an electronic device of this embodiment includes a vacuum vessel for placing the interior under vacuum. Principal components such as the stage 24, mask 1, and squeegees 31, 32 are disposed inside the vacuum vessel. The apparatus is capable of positioning the resin in a vacuum atmosphere. The substrate 5 can be fixed on an upper surface, i.e., a mounting surface, of the stage 24. The substrate 5 can be fixed by, for example, using a flexible adhesive sheet, or by providing the mounting surface with multiple suction holes. For example, as shown in FIG. 21, when a depression 24a is formed in the upper surface of the stage 24, and a flexible double-sided adhesive sheet 24b is attached to the bottom surface of the depression 24a, the bottom portion 8b of each casing 8 can be attached and fixed to the double-sided adhesive sheet 24b. This fixing method can reduce any dimensional error in the stage 24 or substrate 5 through the use of the flexible double-sided adhesive sheet 24b, thereby making the shape of the resin filled in the casings 8 even. The flexible double-sided adhesive sheet 24b includes a flexible base material having an adhesive layer on both surfaces thereof, and examples of flexible base materials include synthetic resins such as polyester resin, polyamide resin, polyurethane resin, and the like; natural and synthetic rubbers; etc.

The apparatus for manufacturing an electronic device of this embodiment includes a pressure adjuster for adjusting the pressure inside the vacuum vessel. The pressure adjuster of this embodiment includes a vacuum pump. The vacuum pump is connected to the vacuum vessel. The pressure adjuster includes a pressure recovery valve for recovering the pressure inside the vacuum vessel.

The method for manufacturing an electronic device of this embodiment is described next. The method includes the step of resin-encapsulating each electronic component by supplying a resin to the base on which the electronic components are disposed. In this embodiment, a first resin is charged into the region surrounded by each casing 8, so as to cover the electronic components disposed on the surface of the base. In this embodiment, the step of charging a first resin is performed by using screen printing to position the first resin.

Referring to FIG. 1, the substrate 5 is placed on the mounting surface of the stage 24. The substrate 5 and the mask 1 are positioned relative to each other. The substrate 5 is positioned so that the region surrounded by each casing 8 is located immediately below each opening 1a in the opposing mask 1. The casings 8 and openings 1a are located coaxially. The resin 10 as a first resin is supplied to the region of the main surface of the mask outside the regions with the openings 1a. A viscous liquid resin is used as the resin 10. Examples of resins usable as the resin 10 include various types of resins such as epoxy resins, silicone resins, acrylic resins, silicone-modified epoxy resins, etc.

The pressure adjuster then evacuates the inside of the vacuum vessel by driving the pressure adjuster, thereby creating a vacuum atmosphere. When a resin is positioned in a vacuum atmosphere, air inside the resin can be discharged to prevent bubbles from remaining inside the resin.

The squeegee 31 is then lowered, as indicated by the arrow 61. The squeegee 31 comes into contact with the resin 10. In this embodiment, the squeegee 31 is lowered to a position at a distance from the plate-like portion 1c so that it does not come into contact with the plate-like portion 1c of the mask 1.

Figure 2:
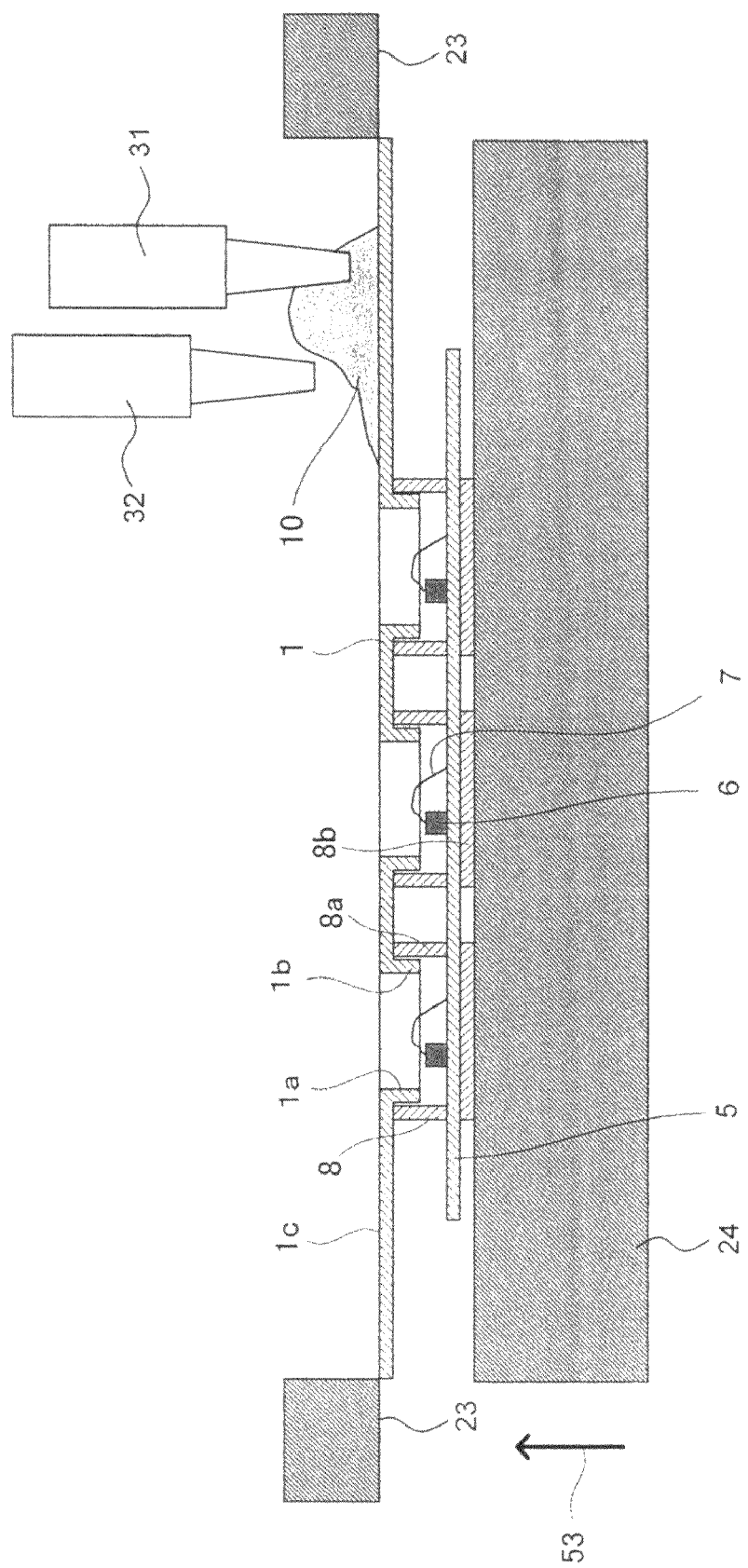
FIG. 2 is a diagram illustrating a second step of the method for manufacturing an electronic device according to the first embodiment.

FIG. 2 is a diagram illustrating a second step of the method for manufacturing an electronic device according to this embodiment. The stage 24 is raised, as indicated by the arrow 53. The controller controls the support device to raise the stage 24 to a height such that the plate-like portion 1c of the mask 1 comes into contact with the top surface of each wall portion 8a. Each rib 1b of the mask 1 is fitted into the region surrounded by each wall portion 8a. The rib 1b is disposed inside the region surrounded by each wall portion 8a.

Figure 3:
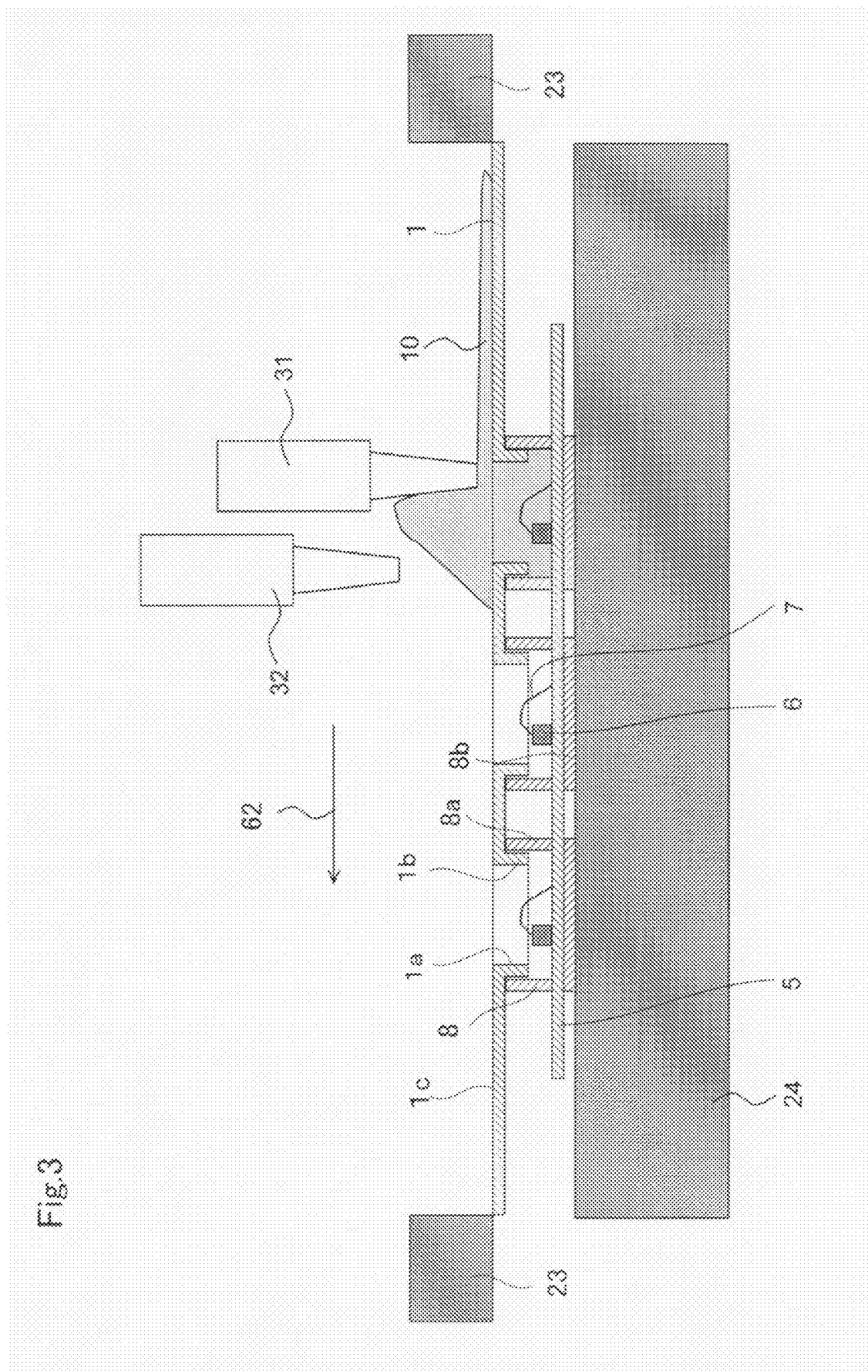
FIG. 3 is a diagram illustrating a third step of the method for manufacturing an electronic device according to the first embodiment.
Figure 4:
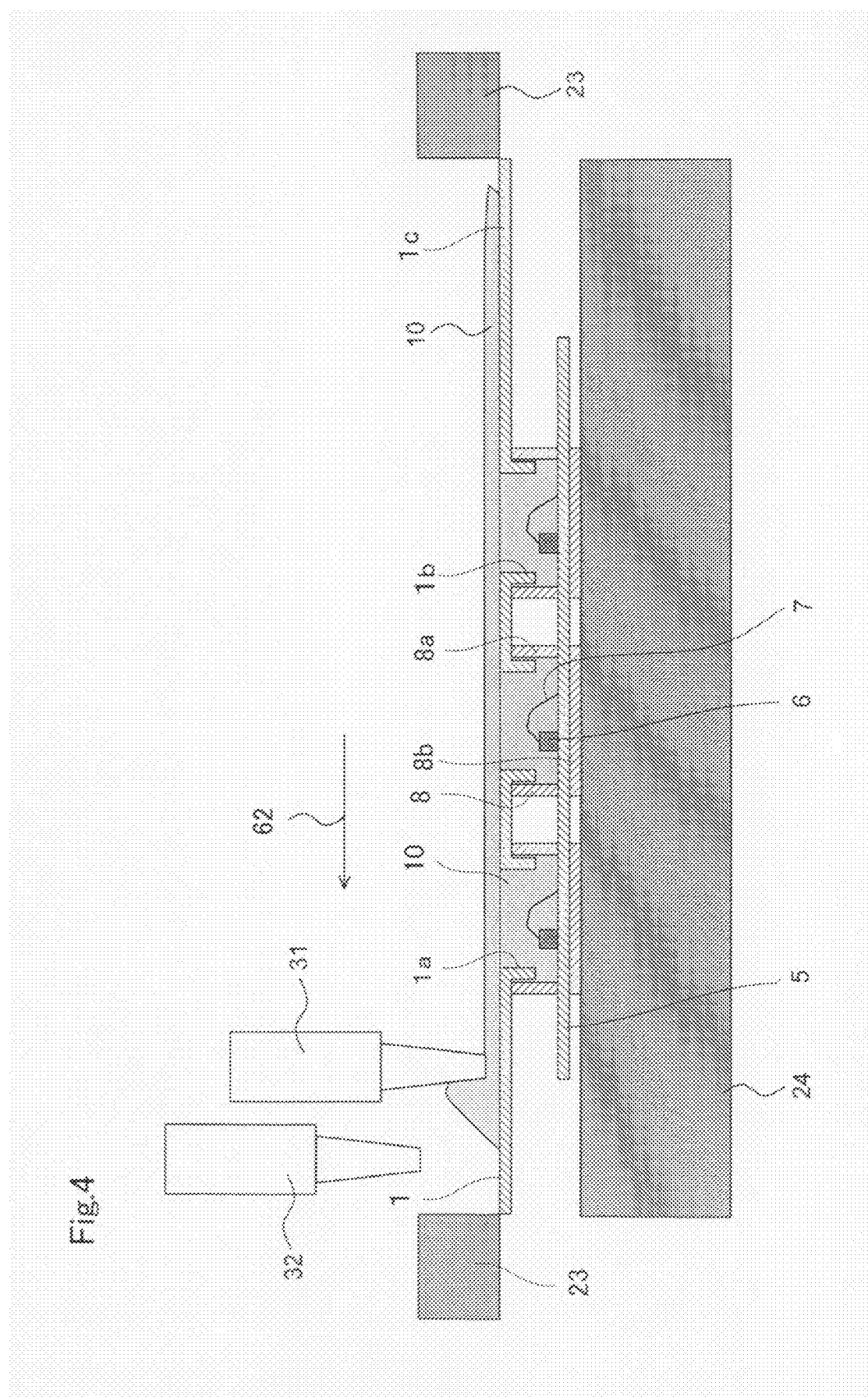
FIG. 4 is a diagram illustrating a fourth step of the method for manufacturing an electronic device according to the first embodiment.

FIG. 3 is a diagram illustrating a third step of the method for manufacturing an electronic device according to this embodiment. FIG. 4 is a diagram illustrating a fourth step of the method for manufacturing an electronic device according to this embodiment. Referring to FIGS. 3 and 4, the step of moving a first squeegee is performed to move the squeegee 31. The squeegee 31 is moved along the main surface of the mask 1, as indicated by the arrow 62. The squeegee 31 is moved from one end of the mask 1 to the other end. As the squeegee 31 moves, a predetermined thickness of a resin layer is formed on the upper surface of the mask 1, while simultaneously the liquid resin 10 can be charged into the regions surrounded by the casings 8 via the through-holes 1a of the mask 1. The inside of each casing 8 is filled with the resin 10. The electronic components 6 disposed on the surface of the substrate 5 are embedded in the resin 10.

Figure 5:
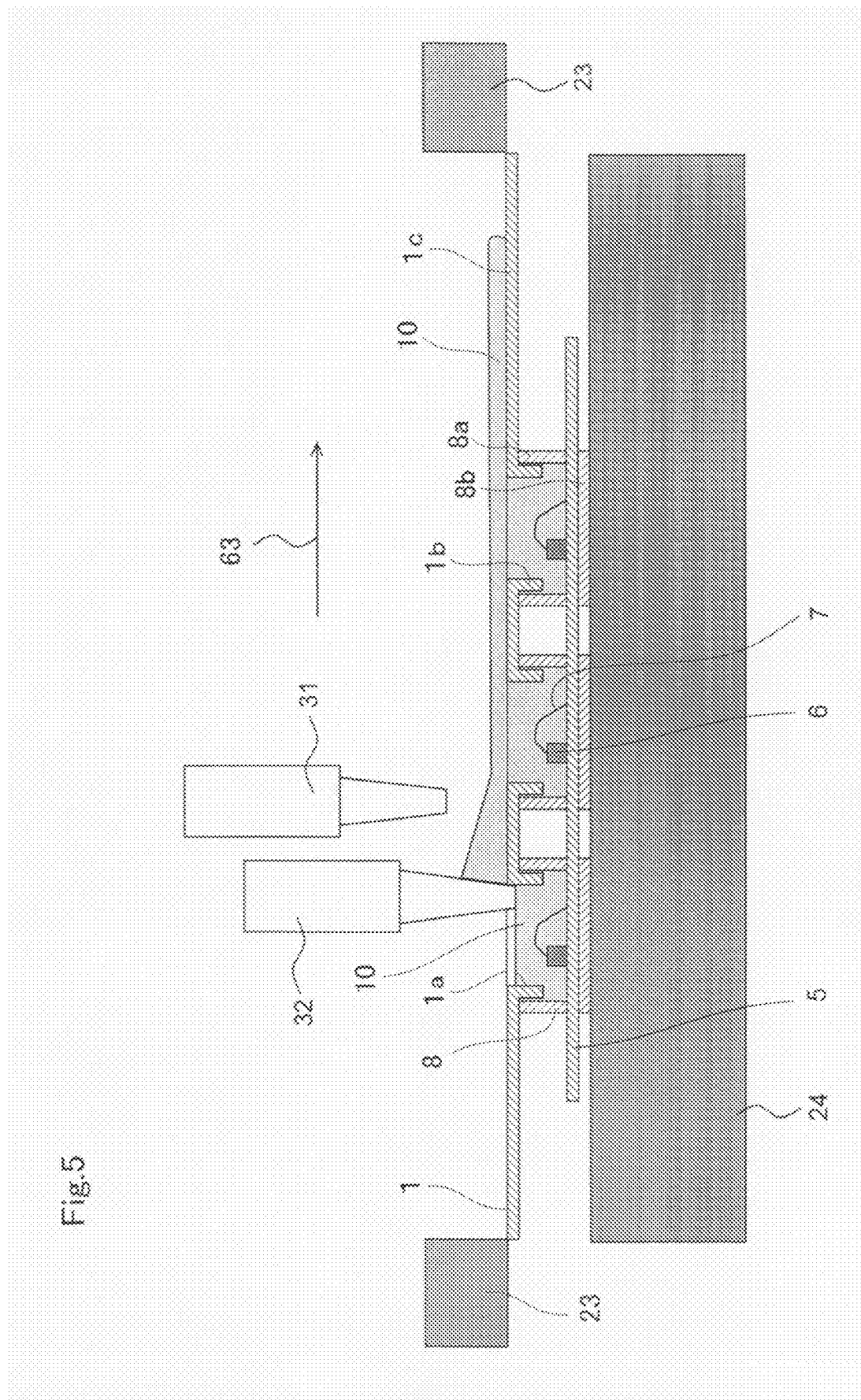
FIG. 5 is a diagram illustrating a fifth step of the method for manufacturing an electronic device according to the first embodiment.

FIG. 5 is a diagram illustrating a fifth step of the method for manufacturing an electronic device according to this embodiment. The step of moving a second squeegee is next performed to move the squeegee 32. While raising the squeegee 31, the squeegee 32 is lowered to come into contact with the resin layer on the mask 1. In this embodiment, the tip of the squeegee 32 comes into contact with the plate-like portion 1c of the mask 1. As indicated by the arrow 63, the squeegee 32 is moved from one end of the mask 1 to the other end. As the squeegee 32 thus moves in the reverse direction, any excess portion of the resin 10 can be removed.

Figure 6:
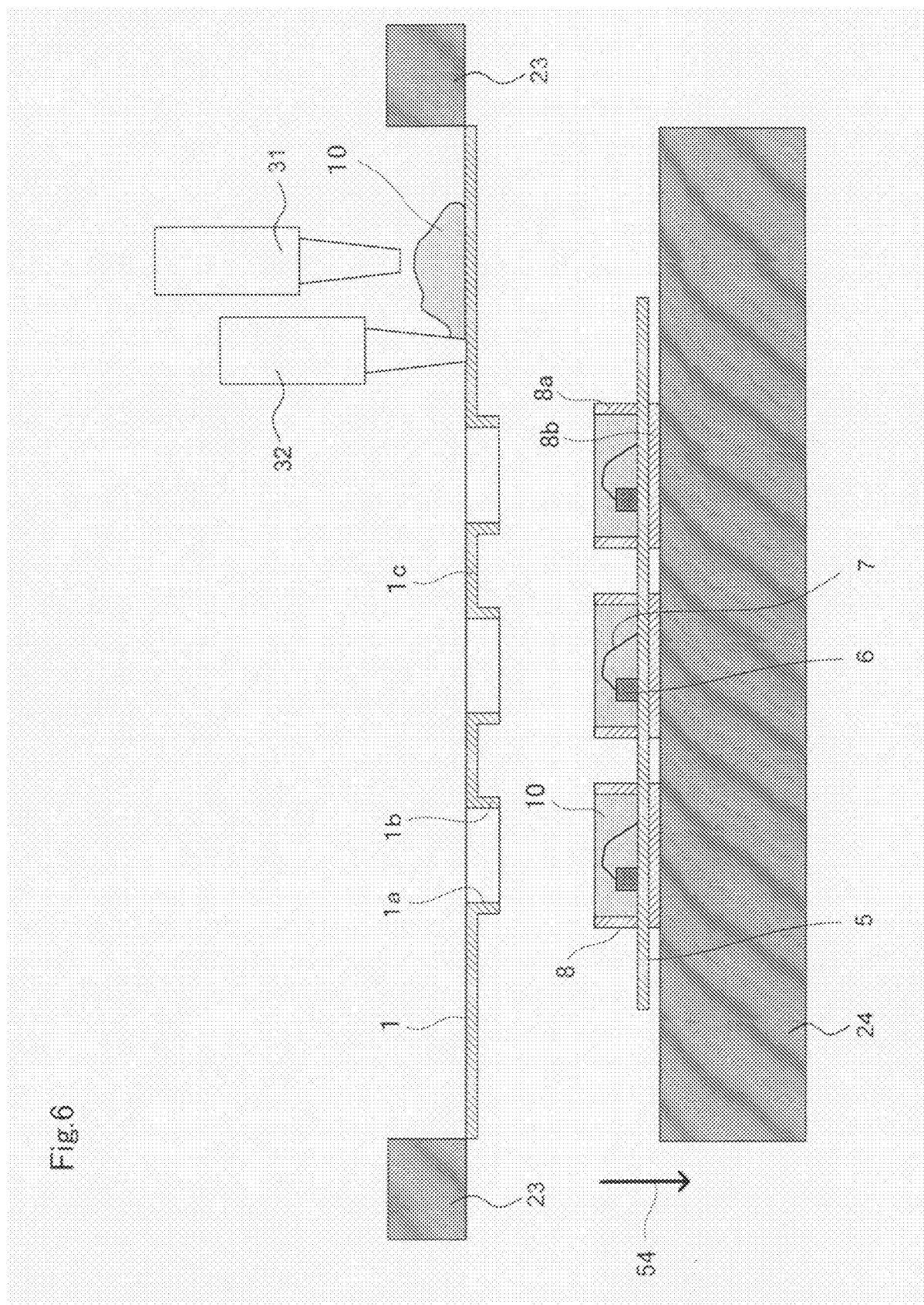
FIG. 6 is a diagram illustrating a sixth step of the method for manufacturing an electronic device according to the first embodiment.

FIG. 6 is a diagram illustrating a sixth step of the method for manufacturing an electronic device according to this embodiment. When the motion of the squeegee 32 has completed, the controller controls the raising and lowering device to lower the stage 24, as indicated by the arrow 54. When the stage 24 has been lowered, the vacuum vessel is left open to the atmosphere. In each of the lead frames, the resin 10 is positioned inside the region surrounded by each casing 8. Each of the electronic components 6 is covered with the resin 10. In this embodiment, when the stage 24 is lowered, the resin becomes stringy at the lower ends of each rib 1b, and the resin, which is placed back because of its stringiness into each casing 8, flows within the casing 9 so as to fill the space that has been occupied by the rib 1b. Consequently, the surface of the resin 10 becomes flat such that it is substantially flush with the open surface of each casing 8.

The substrate 5 is then removed from the vacuum vessel, and then the step of curing the first resin is performed to cure the resin 10 as the first resin. In this embodiment, curing is performed by drying the resin 10 while applying pressure, using a pressure oven. The curing step is not limited to this method, and any curing method may be employed, such as the use of a far-infrared furnace, irradiation of light such as UV light, etc.

Figure 7:
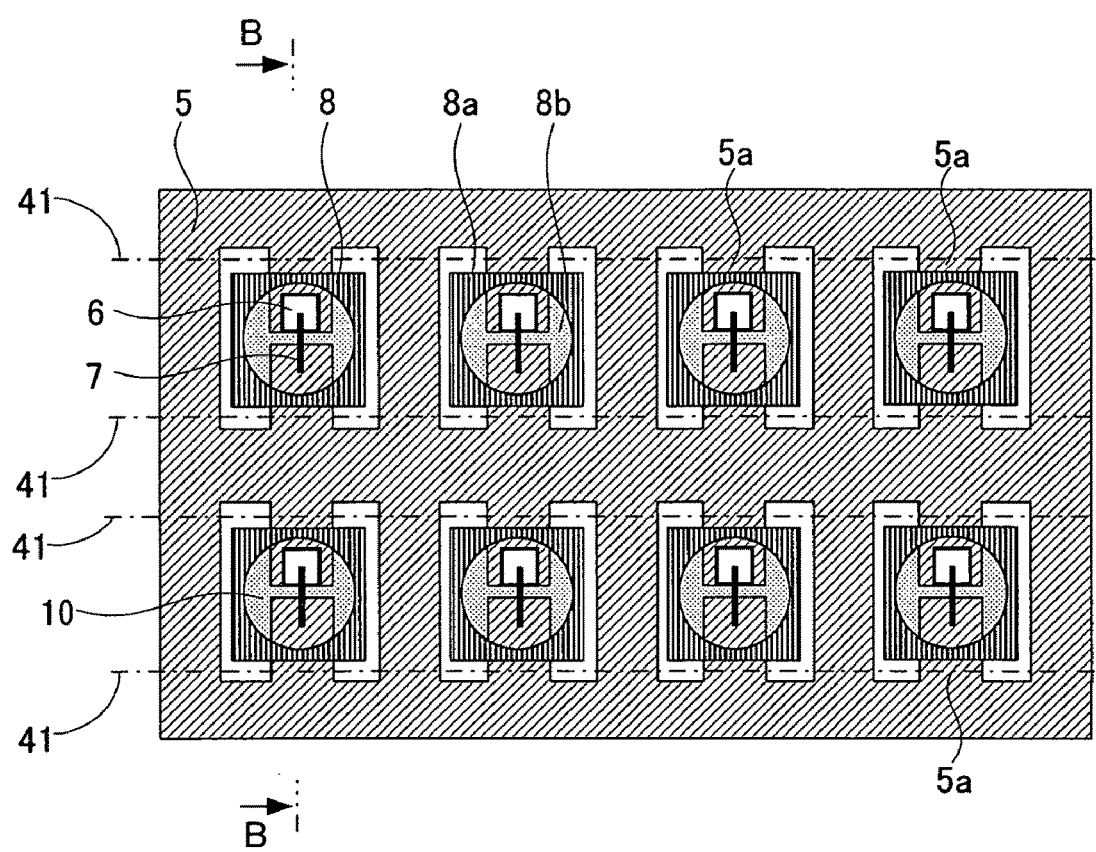
FIG. 7 is a schematic plan view of a base in which a first resin has been positioned according to the first embodiment.

FIG. 7 illustrates a schematic plan view of a base according to this embodiment when it is filled with the first resin. The step of cutting the substrate 5, i.e., the base, is then performed to separate the substrate 5 into individual lead frames 5a. Individual lead frames 5a can be obtained by cutting the substrate 5 along the scribe lines 41.

In this embodiment, a resin is charged into the region surrounded by each casing using screen printing. Using this method, the resin can be applied to a plurality of lead frames in a short period of time. This results in increased productivity. This further reduces variations in the amount of the resin charged into the regions surrounded by the casings, thereby making the surface of the resin even.

In this embodiment, a mask is used that has a thickness such that the top surface of the charged resin becomes flat. The thickness of the mask here refers to the thickness of the portion of the mask in which the through-holes are formed. When ribs are formed along the through-holes in the mask, the thickness of the mask refers to the thickness of the portion of each rib. The surface of the resin 10 can be made flat by making the thickness of the mask 1 small. A mask with, for example, a thickness of at least 0.1 mm and not more than 0.5 mm is preferably used to make the resin surface flat. A mask with a thickness of at least 0.1 mm and not more than 0.3 mm is more preferable. The thickness of the mask is preferably changed according to the properties of the resin to make the surface of the resin into a desired shape.

Squeegees made of materials with high hardness can be used as the squeegees 31, 32. For example, squeegees made of 6,6 nylon or the like can be used as the squeegees 31, 32.

When making the top surface of the resin 10 flat, if excessive resin is transferred depending on the thickness of the mask and the like, a squeegee with a lower rigidity than that of the squeegee 31 is preferably used as the reverse squeegee 32. An elastic squeegee is preferably used as the squeegee 32.

For example, a squeegee 32 made of an elastic rubber material such as urethane rubber or the like is used. In the step of moving the second squeegee, the squeegee 32 is moved while being pressed against the surface of the plate-like portion 1c of the mask 1. At this time, the tip of the squeegee 32 is bent. Using this method, a portion of the resin 10 inside the through-holes 1a can be removed as the squeegee 32 passes the through-holes 1a of the mask 1, thereby preventing excessive resin from being transferred. Consequently, as shown in FIG. 6, the top surface of the resin 10 that remains in each casing 8 after the removal of the mask 1 can be made flat. In this manner, when resin is filled into the through-holes 1a while forming a resin layer on the mask 1 by using the squeegee 31, and then a portion of the resin inside the through-holes 1a is scraped off by using the squeegee 32, which has a lower rigidity than the squeegee 31, electronic components 6 encapsulated with the resin 10 having flat top surfaces can be readily produced. When such electronic components 6 are light-emitting devices, they can emit light over a wide region from the flat top surfaces of the resin 10, making them suitable for use as, for example, a light-emitting apparatus for indoor use.

Figure 8:
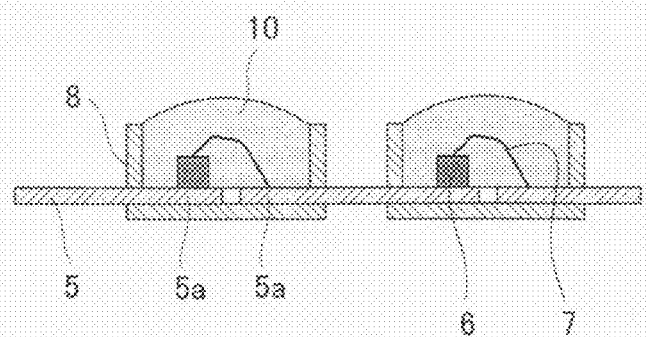
FIG. 8 is a schematic cross section of a base for use in explaining another method for manufacturing an electronic device according to the first embodiment.

FIG. 8 is a schematic cross section of a base for use in explaining another method for manufacturing an electronic device according to this embodiment. FIG. 8 illustrates a cross section taken along the line B-B of FIG. 7. In this method for manufacturing an electronic device, the top surface of the resin 10 inside the casing 8 has a bulging cross section. The top surface of the resin 10 is curved. The top surface of the resin 10 is convex. When the electronic components 6 are light-emitting devices, making the resin into such a shape increases the directivity of light emitted from the electronic components 6.

The use of a thick mask in the step of charging the first resin enables more resin to be transferred, making the surface of the resin bulge. When, for example, the through-holes are 3.0 mm in diameter, a mask with a thickness of at least 0.8 mm and not more than 1.5 mm is preferably used to make the surface of the resin bulge. When the through-holes are 5.0 mm in diameter, a mask with a thickness of at least 1.5 mm and not more than 3.0 mm is preferably used. When the through-holes are 7.0 mm in diameter, a mask with a thickness of at least 2.0 mm and not more than 5.0 mm is preferably used.

Figure 9:
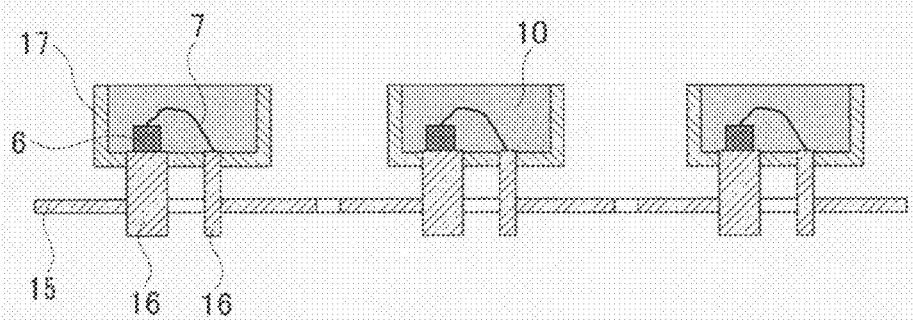
FIG. 9 is a schematic cross section of another base according to the first embodiment.
Figure 10:
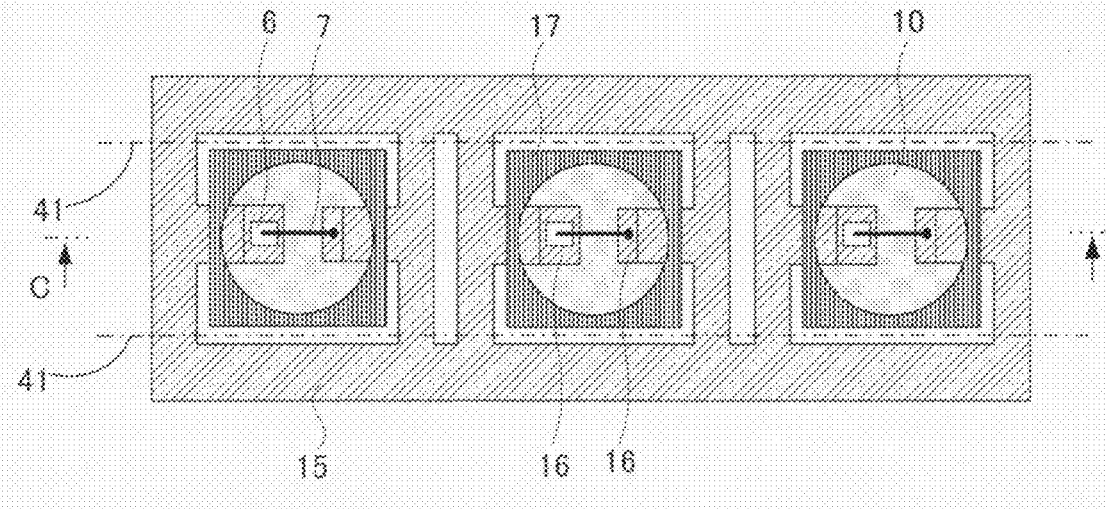
FIG. 10 is a schematic plan view of another base according to the first embodiment.

FIG. 9 illustrates a schematic cross section of another base according to this embodiment. FIG. 10 shows a schematic plan view of this base. FIG. 9 illustrates a cross section taken along the line C-C of FIG. 10. This base includes a substrate 15 and leads 16 connected upright from the substrate 15. The electronic device manufactured using this base includes lead frames with bar-like leads 16.

A casing 17 is fixed to leads 16. The casing 17 in this embodiment is a housing member with a box shape in which one surface is open. The casing 17 can store the resin 10 inside. Each electronic component 6 is fixed to one lead 16. A wire 7 is connected to the electronic component 6 and the other lead 16. Also in this example where separate housing members are formed as casings, the productivity can be increased, and the shape of the resin can be made even, by charging a resin using screen printing in the step of charging the first resin.

When this base is used, the step of separating the base subsequent to the step of charging the first resin includes, for example, cutting the leads 16. In this manner, lead frames composed of bar-like members can be manufactured. Alternatively, referring to FIG. 10, lead frames each composed of a portion of the substrate 15 and leads 16 can be produced by cutting the substrate 15 along the scribe lines 41. As another alternative, a plurality of lead frames formed on a base may be commercialized without being separated into individual lead frames from the base.

Figure 11:
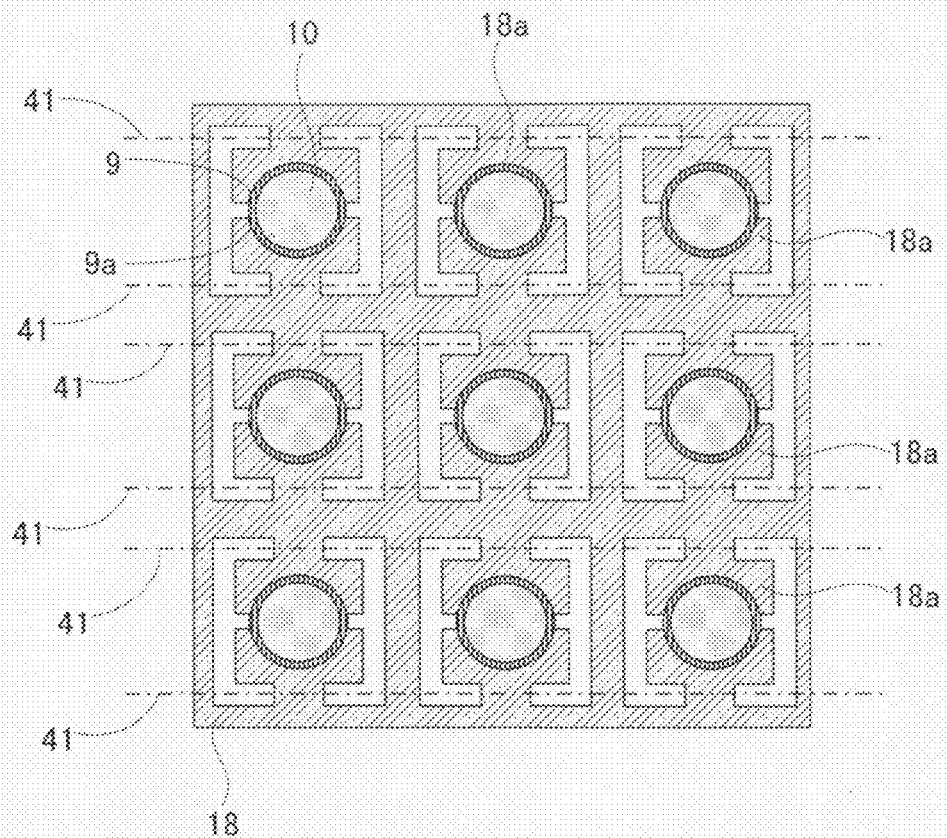
FIG. 11 is a schematic plan view of still another base according to the first embodiment.

FIG. 11 illustrates a schematic plan view of still another base according to this embodiment. This base includes a substrate 18. Casings 9 are formed on a surface of the substrate 18. Each casing 9 has a wall portion 9a and the surface of the substrate 18. The wall portion 9a of the casing 9 has a tubular shape. In this manner, the wall portion of each casing can have any shape that is capable of storing the resin inside. The step of charging the first resin using this base also enables the resin 10 to be charged into each casing 9, using screen printing. Individual lead frames 18a can be formed by cutting the substrate 18 along the scribe lines 41 after curing the resin 10.

Although the step of charging the first resin is performed in a vacuum atmosphere in this embodiment, the step may also be performed at normal pressure.

Although the electronic components of this embodiment are light-emitting diodes, any electronic components may be used. For example, semiconductor electronic components can be used. Examples of usable semiconductor electronic components include ICs (integrated circuits) and optoelectronic components such as PDs (photodiodes), photocouplers, etc.

Although the shape of the region surrounded by each casing (the shape of the opening defined by each wall portion) is circular from a plan view in this embodiment, the shape surrounded by each casing may have any shape such as oval, rectangular, etc, from a plan view. While the casings of this embodiment are rectangular in cross section, the casings may be of any shape in cross section, such as trapezoidal (tapered).

Although a single electronic component is disposed in each region surrounded by a casing in this embodiment, a plurality of electronic components may be disposed in each region surrounded by a single casing.

Second Embodiment

Figure 12:
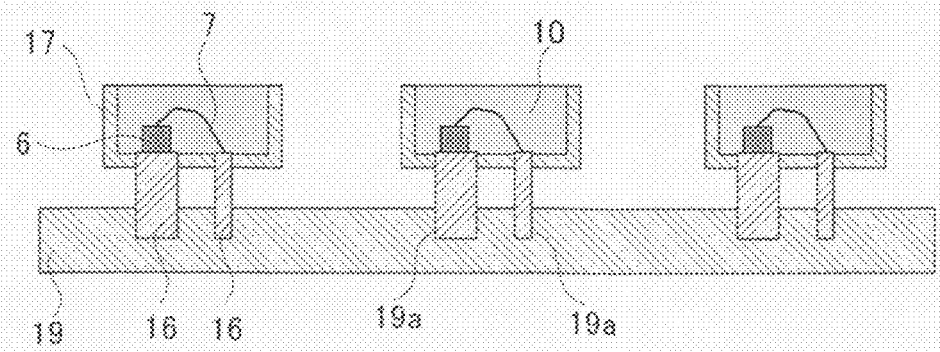
FIG. 12 is a schematic cross section of a holder and lead frames according to the second embodiment.
Figure 13:
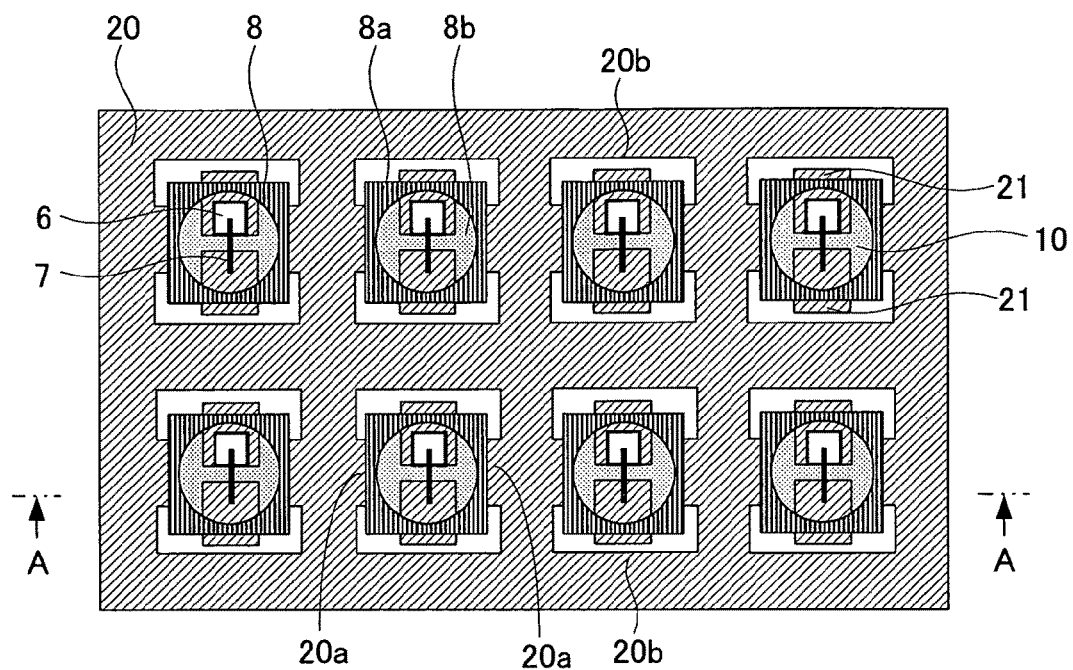
FIG. 13 is a schematic plan view of another holder and other lead frames according to the second embodiment.
Figure 14:
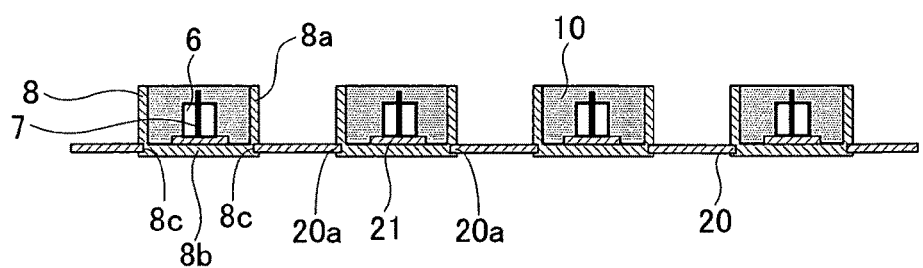
FIG. 14 is a schematic cross section of another holder and other lead frames according to the second embodiment.

Referring to FIGS. 12 to 14, a method for manufacturing an electronic device according to a second embodiment is described. In this embodiment, a first resin is charged into each casing with the lead frames being held on a holder.

FIG. 12 shows a schematic cross section of a holder and lead frames according to this embodiment. Each lead frame of this embodiment has bar-like leads 16. The lead frame of this embodiment has two leads 16. Each electronic component 6 is fixed to one of the leads 16. A wire 7 is connected to the electronic component 6 and the other lead 16. Each casing 17 is a housing member with a box shape in which one surface is open. The plurality of leads 16 in this embodiment are fixed to each other via the casing 17.

The holder 19 is made of a metal casing, and has a plurality of depressions 19a. The depressions 19a are formed so that the leads 16 are fitted therein. The depressions 19a are formed to support the leads 16. The plurality of lead frames are detachably fixed to the holder 19. The lead frames are fixed to the holder 19 by fitting the leads 16 of each lead frame into the depressions 19a.

The step of charging a first resin is then performed to charge a first resin into each casing 17. As in the first embodiment, using a mask that has through-holes in positions corresponding to the regions surrounded by the casings 17, a resin 10 as the first resin is positioned inside the region surrounded by each casing 17. More specifically, the resin 10 is charged into the casings 17, using screen printing. The step of curing the first resin is then performed to cure the resin 10.

Each lead frame is subsequently detached from the holder 19 to manufacture each separate lead frame. This embodiment also provides a method for manufacturing an electronic device that is capable of improving productivity, and making the resin shape even.

In this embodiment, the lead frames are supported by the bar-like leads being fitted into the depressions of the holder; however, the holder may be configured in any manner capable of holding the lead frames. For example, the holder may have nail portions, and the lead frames may be held by nail portions pinching each lead frame.

Although this embodiment has described an example of lead frames with bar-like leads, the invention can also be applied to plate-like lead frames. In this case also, the holder may be configured in any manner capable of detachably holding the plate-like lead frames.

FIG. 13 illustrates a schematic plan view of another holder and other lead frames according to this embodiment. FIG. 14 illustrates a schematic cross section of the holder and lead frames according to this embodiment. FIG. 14 is a cross section taken along the line A-A of FIG. 13. The holder 20 of this embodiment has a plate-like shape. The holder 20 has openings 20b. The holder 20 has nail portions 20a that protrude through the inside of the openings 20b.

Each of the lead frames of this embodiment has a plurality of leads 21. The plurality of leads 21 have a plate-like shape. The leads 21 face opposite to each other. Each electronic component 6 is fixed to one of the leads 21. The wire 7 is connected to the electronic component and the other lead 21. Each lead frame is disposed inside an opening 20b. The leads 21 opposite to each other are fixed with the casing 8. The casing 8 has a box shape in which one surface is open.

A wall portion 8a of each casing 8 has depressions 8c. The depressions 8c are formed so that the nail portions 20a of the holder 20 are fitted therein. The lead frames are held on the holder 20 by the nail portions 20a of the holder 20 being fitted into the depressions 8c of each casing 8. In this manner, the holder may be formed to hold the lead frames via an interposing member such as a casing.

Also with these holder and lead frames, a plurality of lead frames are first held onto the holder having each casing. A resin 10 as the first resin can then be positioned, using screen printing. After the resin 10 has cured, each lead frame is detached from the holder to thereby manufacture each separate lead frame.

Since the other parts of the structure, method, action and effects are the same as in the first embodiment, the description is not repeated herein.

Third Embodiment

Figure 15:
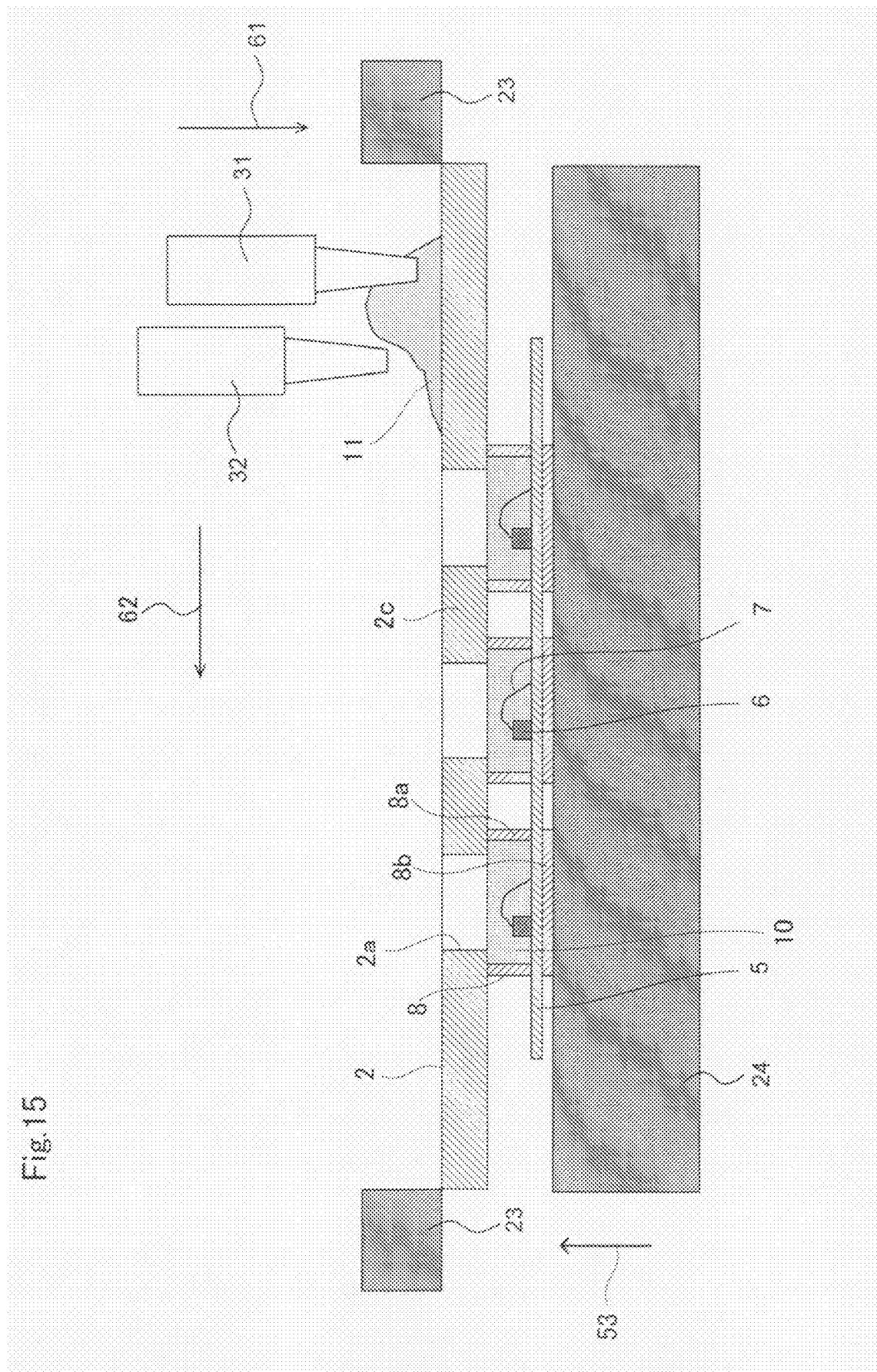
FIG. 15 is a diagram illustrating a first step of a method for manufacturing an electronic device according to a third embodiment.
Figure 16:
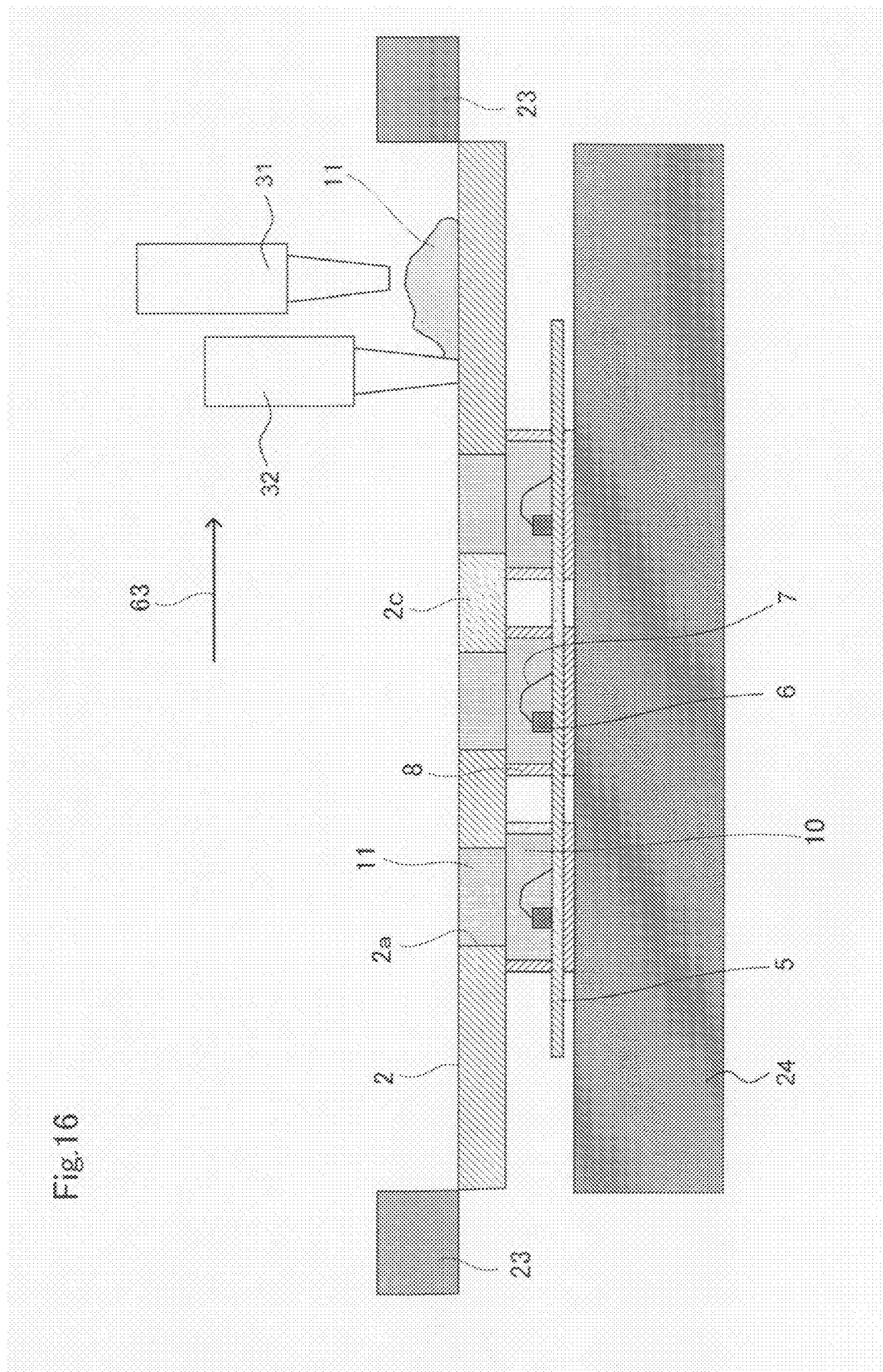
FIG. 16 is a diagram illustrating a second step of the method for manufacturing an electronic device according to the third embodiment.
Figure 17:
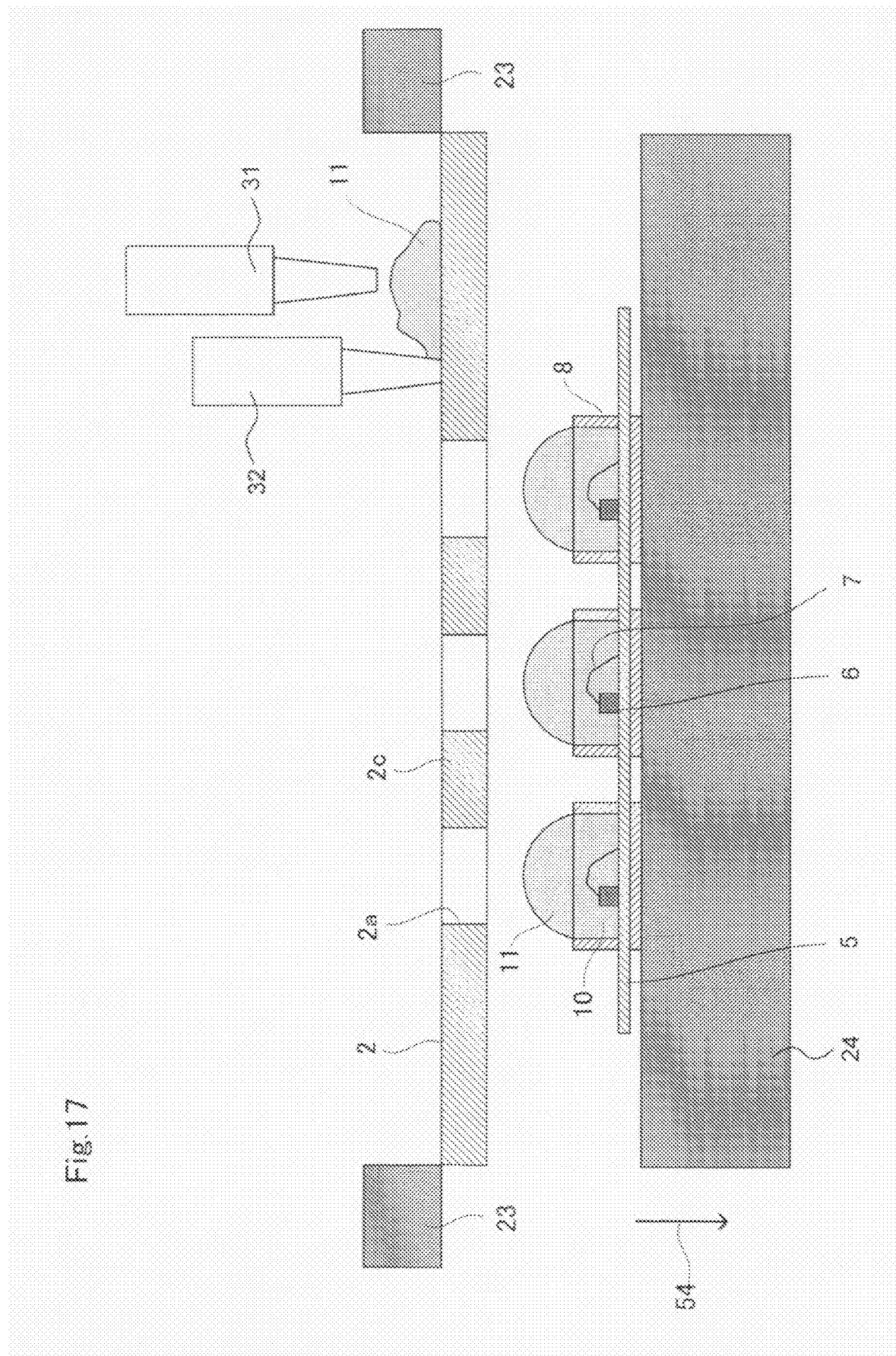
FIG. 17 is a diagram illustrating a third step of the method for manufacturing an electronic device according to the third embodiment.

Referring to FIGS. 15 to 17, a method for manufacturing an electronic device according to a third embodiment is described.

FIG. 15 is a diagram illustrating a first step of the method for manufacturing an electronic device of this embodiment. In this embodiment, the step of positioning a second resin is performed to additionally position the second resin on the surface of a first resin, using screen printing. In this embodiment, as described first in the first embodiment, the step of charging a first resin is performed to position the first resin inside each casing in such a manner as to make the surface of the first resin flat. The step of curing the first resin is then performed.

A substrate 5, on which a resin 10 as the first resin has cured, is positioned inside a vacuum vessel. In the step of positioning the second resin of this embodiment, a mask 2 is used as a second mask. The mask 2 has through-holes 2a. The through-holes 2a are formed in positions that correspond to the regions surrounded by casings 8 fixed to the substrate 5.

From a plan view, the shape of the surface of each through-hole 2a in this embodiment is the same as that of each through-hole 1a in the mask 1 of the first embodiment. The mask 2 of this embodiment has a flat, plate-like portion 2c thicker than that of the mask used in the step of charging the first resin. The through-holes 2a are greater in height than the through-holes 1a in the mask 1 used in the step of charging the first resin. The mask 2 of this embodiment does not have ribs. The second mask is not limited to this embodiment, and a mask with ribs may also be used.

The substrate 5 is positioned so that each portion of the resin 10 is located immediately below each through-hole 2a. The substrate 5 and mask 2 are positioned relative to each other. Each casing 8 and each through-hole 2a are located coaxially. The substrate 5 and mask 2 are positioned so that the through-holes 2a are located in positions corresponding to the regions surrounded by the casings 8. When a mask with ribs is used, the substrate is positioned so that each rib is located in a position corresponding to the region surrounded by each casing. That is to say, the substrate is located in a position such that the edge surface of each rib comes into contact with each resin or casing in the subsequent step.

A resin 11 as the second resin is supplied to the main surface of the mask 2. In this embodiment, the resin 11 as the second resin is the same as the resin 10 used in the step of charging the first resin. A viscous liquid resin is also used as the second resin. Examples of resins usable as the second resin include various types of resins such as epoxy resins, silicone resins, acrylic resins, silicone-modified epoxy resins, etc. A resin different from the first resin may also be used as the second resin.

The inside of the vacuum vessel is then evacuated to create a vacuum atmosphere. By positioning the resin in a vacuum atmosphere, it is possible to prevent bubbles from remaining in the resin 11. A squeegee 31 is lowered as indicated by the arrow 61. The squeegee 31 comes into contact with the resin 11.

A stage 24 is then raised, as indicated by the arrow 53, by the controller controlling the raising and lowering device of the support device. The controller raises the stage 24 until the plate-like portion 2c of the mask 2 comes into contact with the surface of the resin 10. The top surface of a wall portion 8a of each casing 8 comes into contact with the plate-like portion 2c of the mask 2. When a mask with a rib around each through-hole is used, the stage 24 is raised until the edge surface of each rib comes into contact with the resin or wall portion.

In this embodiment, the position at which the plate-like portion 2c of the mask 2 comes into contact with the resin 10 has been preset, and the controller controls the raising and lowering device to stop at that position. The controller is not limited to this embodiment, and may also be configured to stop the raising and lowering device of the support device by sensing when the plate-like portion has come into contact with the surface of the resin.

As in the step of charging the first resin, the resin 11 is then charged into the through-holes 2a by moving the squeegees 31, 32, as indicated by the arrow 62. The resin 11 is positioned on the resin 10. The squeegees 31, 32 are moved from one end of the mask 2 to the other end.

FIG. 16 is a diagram illustrating a second step of the method for manufacturing an electronic device of this embodiment. As in the step of charging the first resin, the reverse squeegee 32 is subsequently moved as indicated by the arrow 63, with the squeegee 31 being raised and the squeegee 32 being lowered.

FIG. 17 is a diagram illustrating a third step of the method for manufacturing an electronic device of this embodiment. The controller then lowers the stage 24, as indicated by the arrow 54, by driving the raising and lowering device of the support device. The mask 2 is separated from the resin 10, resulting in the resin 11 being positioned on the surface of the resin 10. A convex surface is formed by the surface tension of the resin 11. The surface of the resin 11 is curved.

The step of curing the second resin is next performed to completely cure the resin 11. In this embodiment, the resin 11 is cured by drying in a pressurized oven dryer. The step of curing the second resin may employ any method of curing resin.

In this embodiment, a large amount of resin can be positioned on the surface of the first resin, allowing the surface to be more spherical than in the case of making the surface of the first resin curved in the first embodiment (see FIG. 8). When the electronic components are light-emitting devices, a lens effect of converging light toward the front surface can be achieved more effectively. Such a lens effect can be utilized for light-emitting devices that are preferred to have high light-gathering power such as, for example, traffic signal lights, flashlights, automotive tail lamps, and the like.

The surface of the resin can also be curved by molding using a mold such as a transfer mold; however, when a mold is used, the resin may be cured with bubbles included inside. In this embodiment, the surface of the resin can be curved while preventing the inclusion of bubbles. Moreover, after positioning the resins, it is not necessary to include a separate lens component or the like to gather light, making it easy to manufacture electronic devices with high light-gathering power. In the step of positioning the second resin, the resin is positioned using screen printing, allowing electronic devices to be manufactured with high productivity. Moreover, the resin for sealing the light-emitting devices can easily be made convex.

In this embodiment, the second resin is positioned after the first resin has been completely cured; however, in the step of curing the first resin, the second resin may be positioned after the first resin has cured to a hardness such that the shape of the first resin does not change. Alternatively, the second resin may be positioned after the first resin has cured to a hardness such that it does not flow even if the substrate is inclined.

In this embodiment, the mask used in the step of positioning the second resin is different from the mask used in the step of charging the first resin. In this manner, the amount of the second resin positioned on the surface of the first resin can be adjusted as desired. The mask used in the step of positioning the second resin is not limited to this embodiment, and may be the same mask as that used in the step of charging the first resin.

In this embodiment, the through-holes in the first mask used in the step of charging the first resin have the same shape and size, from a plan view, as the through-holes of the second mask used in the step of positioning the second resin; however, the through-holes in the second mask may have an aperture area that is smaller than that of the through-holes in the first mask. That is to say, when the shapes of the through-holes in the first and second masks are compared from a plan view, the through-holes in the second mask may have a size such that that they are contained within the through-holes in the first mask. Alternatively, the through-holes in the second mask may be greater in size than the through-holes in the first mask. This can increase the amount of the resin filled in the step of positioning the second resin, and is thus particularly effective for increasing the protruding height of the resin. The shape of the through-holes in each mask is not necessarily circular from a plan view, and may be any shape.

In this embodiment, an electronic device with two layers of resin is produced, with the second resin positioned on the surface of the first resin; however, an electronic device with three or more layers of resin may also be produced by repeated screen printing.

In this embodiment, the step of positioning the second resin is performed in a vacuum atmosphere; however, it may also be performed at normal pressure.

Since the other parts of the structure, method, action and effects are the same as in the first or second embodiment, the description is not repeated here.

Fourth Embodiment

Figure 18:
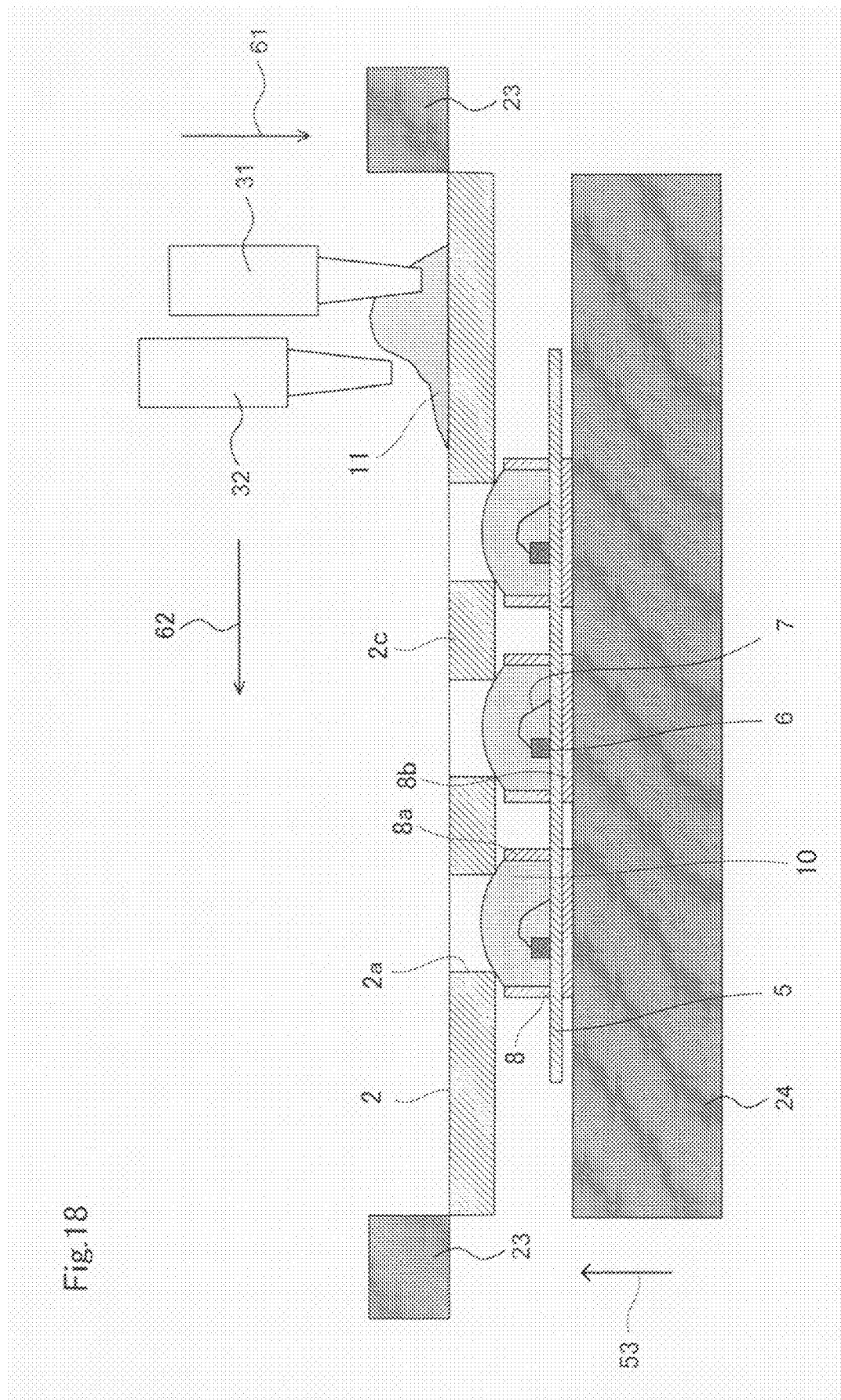
FIG. 18 is a diagram illustrating a first step of a method for manufacturing an electronic device according to a fourth embodiment.

Referring to FIGS. 18 to 20, a method for manufacturing an electronic device according to a fourth embodiment is described.

FIG. 18 is a diagram illustrating a first step of the method for manufacturing an electronic device of this embodiment. In the step of charging a first resin of this embodiment, as first described in the first embodiment, a first resin is positioned so that the surface of the first resin is curved. The step of positioning a second resin is subsequently performed to additionally position a second resin on the surface of the first resin, using screen printing.

A substrate 5, on which a resin 10 as the first resin has cured, is placed inside a vacuum vessel. The same mask as that of the third embodiment is used as a second mask in the step of positioning a second resin in this embodiment. The substrate 5 and the mask 2 are positioned relative to each other. The substrate 5 is positioned so that each portion of resin 10 is located immediately below each through-hole 2a. A resin 11 as the second resin is supplied to the main surface of the mask 2. In this embodiment, the resin 11 as the second resin is the same as the resin 10 used in the step of charging the first resin.

The inside of the vacuum vessel is then evacuated to create a vacuum atmosphere. A squeegee 31 is lowered as indicated by the arrow 61. The squeegee 31 comes into contact with the resin 11. The stage 24 is then raised, as indicated by the arrow 53. The controller raises the stage 24 until the edge portion of each through-hole 2a comes into contact with the curved top surface of the resin 10. The plate-like portion 2c of the mask 2 comes into contact with the surface of the resin 10.

As in the step of charging the first resin, the resin 11 is positioned inside the through-holes 2a by moving the squeegees 31, 32, as indicated by the arrow 62. The resin 11 is positioned while the edge portion of each through-hole 2a in the mask 2 is in contact with the resin 10. The squeegees 31, 32 are moved from one end of the mask 1 to the other end. After that, as in the step of charging the first resin, the reverse squeegee 32 is moved, with the squeegee 31 being raised and the squeegee 32 being lowered. The squeegee 32 is then moved from the other end to the one end.

The resin 11 is positioned on the resin 10 inside each through-hole 2a in the mask 2. Then, as in the step of charging the first resin, the controller lowers the stage 24 by driving the raising and lowering device of the support device. The mask 2 is separated from the resin 10. The resin 11 is positioned on the surface of the resin 10.

FIG. 19 is a diagram illustrating a second step of the method for manufacturing an electronic device according to this embodiment. In the step of positioning the second resin, the resin 10 and resin 11 are drawn to each other when the substrate 5 is separated from the mask 2. That is to say, the resin 11 is pulled onto the resin 10. This prevents the resin 11 from flowing toward the sides. As a result, the surface of the resin 11 can be more spherical than the surface of the resin 10. While the cross section of the resin 10 is parabolic, the cross section of the resin 11 can be more semi-circular. Therefore, when the electronic components 6 are light-emitting devices, light emitted from the electronic components 6 can be more effectively converged toward the front surface.

Next, the step of curing the resin 10 and resin 11 completely is performed. In this embodiment, the resins 10, 11 are cured by drying in a pressurized oven dryer. This curing step may employ any method to cure the resins completely.

In this embodiment, the first resin used in the step of charging a first resin is the same as the second resin used in the step of positioning a second resin. In this manner, the wettability of both the first resin and the second resin can be the same, effectively allowing the resin to be more spherical. Alternatively, the use of first and second resins that have the same main components effectively allows the resin to be more spherical. Although the first resin and the second resin are the same in this embodiment, different resins may also be used.

In the step of positioning a second resin, the second resin used may have a higher hardness than that of the first resin. For example, a soft resin such as a silicone resin may be used as the first resin, and a hard epoxy resin whose hardness is higher than that of the first resin may be used as the second resin. Using this method, even if defects are found after positioning the first and second resins over each of the plurality of optical elements, they can be partially repaired easily.

When optical elements such as light-emitting devices, light-receiving elements, and the like are covered with only a soft resin, the light-emitting devices, wires, and the like inside may be damaged if touched by a finger or the like. In this embodiment, a soft first resin is positioned over each light-emitting device, and then a thin film of a hard second resin is positioned on the first resin. Even if a defect is found in a single light-emitting device after positioning the second resin, the hard second resin can be easily broken, and then the soft first resin can be easily removed, to repair the defective light-emitting device. Moreover, internal stress can be lessened by positioning a second resin that is harder than the first resin on the surface of the first resin, thereby preventing cracks from being formed inside the resin.

A resin containing an inorganic material can also be used as the first resin. For example, LEDs that emit blue light are used as electronic components. A resin containing a fluorescent material as an inorganic material is used as the first resin. Examples of usable fluorescent materials include YAG (yttrium aluminum garnet), TAG (terbium aluminum garnet), SIALON (a nitride composed of silicon, aluminum, oxygen, and nitrogen), and the like. A translucent resin containing no inorganic material is used as the second resin. In this manner, the wavelengths of part of the light emitted from the blue-light-emitting diodes can be converted to provide a white-light-emitting device.

Particles with a refractive index higher than those of the first and second resins can be used as an inorganic material of the first resin. For example, an inorganic material with a high refractive index, such as zirconium oxide, titanium oxide, or the like, can be used as such an inorganic material. If particles with a large diameter are mixed as a high refractive index inorganic material, the resulting resin will become white, losing the transparency as a whole. For this reason, fine particles are preferably used as an inorganic material. The fine particles preferably have a diameter of 10 μm or less, and more preferably 1 μm or less. This enables the refractive index of the interior resin layer to be higher, and the refractive index of the exterior resin layer to be lower. The refractive index of the outermost resin can be close to that of air, thereby reducing internal light reflection. This results in more efficient light extraction.

The device in which the second resin has a lower refractive index is not limited to this embodiment, and the device may also use a second resin with a refractive index that is lower than that of the first resin. For example, a resin with a refractive index of 1.6, which is higher than that of the second resin, may be used as the first resin, and a resin with a refractive index of 1.4, which is lower then that of the first resin, may be used as the second resin.

FIG. 20 is a diagram illustrating the steps of another method for manufacturing an electronic device according to this embodiment. In this method for manufacturing an electronic device, a mask 3 is used as a second mask in the step of positioning a second resin. The mask 3 has through-holes 3a. From a plan view, the through-holes 3a are larger than the through-holes 1a in the mask 1 serving as a first mask in the step of charging a first resin. That is to say, when the shapes of the through-holes in the first and second masks are compared from a plan view, the through-holes in the first mask have a size such that they are contained within the through-holes in the second mask. In addition, from a plan view, the aperture area of the through-holes 3a is slightly larger than the region of the filled first resin, such that the opening edge portions of each through-hole 3a can come into contact with the upper ends of the wall portions 8a.

In this method for manufacturing an electronic device of this embodiment, when the stage 24 is raised as indicated by the arrow 53, the top surface of the wall portion 8a of each casing 8 comes into contact with an edge portion of each through-hole 3a. In this state, the resin 11 as a second resin is positioned using screen printing. Similarly, in this method for manufacturing an electronic device, the second resin can be positioned on the first resin, allowing the cross section of the resin to be more spherical. In addition, electronic devices can be manufactured with high productivity. By thus making the aperture area of the through-holes 3a large, the amount of the resin that is filled can be increased, which is particularly effective when the resin height must be high.

Since the other parts of the structure, method, action and effects are the same as in any of the first to third embodiments, the description is not repeated here.

The above-described embodiments are merely illustrative, and do not limit the present invention. In the drawings, like numerals represent like parts or corresponding parts.

What is claimed is:

1. A method for manufacturing an electronic device comprising a plurality of lead frames individually supporting an electronic component surrounded by a casing, the method comprising steps of:

charging a first resin into each casing on a base on which the plurality of lead frames are formed by:
- using a mask having through-holes in positions corresponding to regions surrounded by the casings;
- positioning the mask in such a manner that the through-holes of the mask are positioned to correspond to the regions surrounded by the casings;
- moving a first squeegee along a surface of the mask to charge the first resin into the regions via the through-holes of the mask; and
- moving a second squeegee along the surface of the mask while pressing the second squeegee against the surface to remove any excess portion of the first resin, thereby making a surface of the first resin flat; and cutting the base to separate the lead frames into individual lead frames.

2. The method according to claim 1, wherein the step of moving the second squeegee uses, as the second squeegee, a squeegee with a rigidity that is lower than that of the first squeegee, thereby making the surface of the first resin flat.

3. A method for manufacturing an electronic device comprising a plurality of lead frames individually supporting an electronic component surrounded by a casing, the method comprising steps of:

charging a first resin into each casing on a base on which the plurality of lead frames are formed by:
- using a mask having through-holes in positions corresponding to regions surrounded by the casings; and
- positioning the mask in such a manner that the through-holes of the mask are positioned to correspond to the regions surrounded by the casings;

curing the first resin;

positioning a second resin on the surface of the first resin, using a mask having through-holes in positions corresponding to the regions surrounded by the casings; and cutting the base to separate the lead frames into individual lead frames.

4. The method according to claim 3, wherein the step of positioning the second resin uses a mask different from the mask used in the step of charging the first resin.

5. A method for manufacturing an electronic device comprising a plurality of lead frames for individually supporting an electronic component surrounded by a casing, the method comprising steps of:

charging a first resin into the casing of each of the plurality of lead frames held by a holder by:
- using a mask having through-holes in positions corresponding to regions surrounded by the casings;
- positioning the mask in such a manner that the through-holes of the mask are positioned to correspond to the regions surrounded by the casings;
- moving a first squeegee along a surface of the mask to charge the first resin into the regions via the through-holes of the mask; and
- moving a second squeegee along the surface of the mask while pressing the second squeegee against the surface to remove any excess portion of the first resin, thereby making a surface of the first resin flat; and detaching each of the lead frames from the holder.

6. The method according to claim 5, wherein the step of moving the second squeegee uses, as the second squeegee, a squeegee with a rigidity that is lower than that of the first squeegee, thereby making the surface of the first resin flat.

7. A method for manufacturing an electronic device comprising a plurality of lead frames for individually supporting an electronic component surrounded by a casing, the method comprising steps of:

charging a first resin into the casing of each of the plurality of lead frames held by a holder by:
- using a mask having through-holes in positions corresponding to regions surrounded by the casings; and
- positioning the mask in such a manner that the through-holes of the mask are positioned to correspond to the regions surrounded by the casings;

curing the first resin; and positioning a second resin on the surface of the first resin, using a mask having through-holes in positions corresponding to regions surrounded by the casings.

8. The method according to claim 7, wherein the step of positioning the second resin uses a mask different from the mask used in the step of charging the first resin.

* * * * *